United States Patent [19]
Gentry et al.

[11] Patent Number: 4,721,472
[45] Date of Patent: Jan. 26, 1988

[54] FIXED CONNECTOR FOR MAKING ELECTRICAL CONNECTIONS TO SURFACE-MOUNT TYPE PRINTED BOARD

[75] Inventors: Jack T. Gentry; John T. Gentry, both of Springfield, Mo.

[73] Assignee: Positronic Industries, Inc., Springfield, Mo.

[21] Appl. No.: 872,515

[22] Filed: Jun. 10, 1986

[51] Int. Cl.$^4$ ............................................. H01R 23/72
[52] U.S. Cl. ........................................................ 439/79
[58] Field of Search .............. 339/17 R, 17 C, 17 LC, 339/176 MP; 439/79, 80, 892

[56] References Cited

U.S. PATENT DOCUMENTS

| | | | |
|---|---|---|---|
| 3,493,916 | 2/1970 | Hansen | 339/17 |
| 3,636,503 | 1/1972 | Bernutz et al. | 339/17 LC |
| 3,696,319 | 10/1972 | Olsson | 339/17 F |
| 4,008,941 | 2/1977 | Smith | 339/91 P |
| 4,186,988 | 2/1980 | Kobler | 339/176 MP |
| 4,200,347 | 4/1980 | Sinclair et al. | 339/17 CF |
| 4,210,376 | 7/1980 | Hughes et al. | 339/17 LC |
| 4,410,230 | 10/1983 | SanMiguel | 339/176 M |
| 4,491,376 | 1/1985 | Gladd et al. | 339/17 LC |
| 4,628,410 | 12/1986 | Goodman et al. | 339/17 C |

FOREIGN PATENT DOCUMENTS 150342  8/1985  European Pat. Off. ........ 339/17 LC

OTHER PUBLICATIONS

Teradyne, Technical Bulletin No. 237, Teradyne Connection Systems, Inc., 1-1985.

*Primary Examiner*—Neil Abrams
*Attorney, Agent, or Firm*—Senniger, Powers, Leavitt and Roedel

[57] ABSTRACT

A fixed connector for use in making electrical connections from an electrical cable having a plurality of conductors to a printed board having surface-mount type conductive traces, the electrical cable having a free cable connector connected to the plurality of conductors. The fixed connector includes a connector device for holding rows of contact tails spaced with a predetermined center-to-center spacing, each contact tail for electrical conduction with one of the plurality of conductors of the electrical cable, the connector device connectable to the free cable connector. The fixed connector also includes an aligning device made of insulating material for aligning the contact tails, the aligning device having a plurality of holes spaced with a predetermined center-to-center spacing different than the predetermined spacing of the contact tails, the holes having centers which are in a single plane, each hole receiving a respective one of the contact tails, the contact tails protruding from the aligning device remote from the connector device for attachment to the conductive traces on the printed board.

17 Claims, 9 Drawing Figures

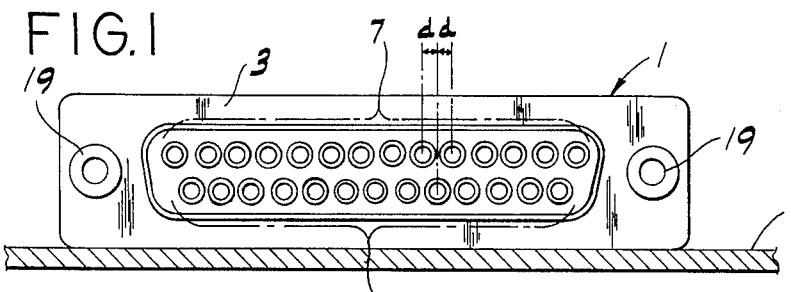
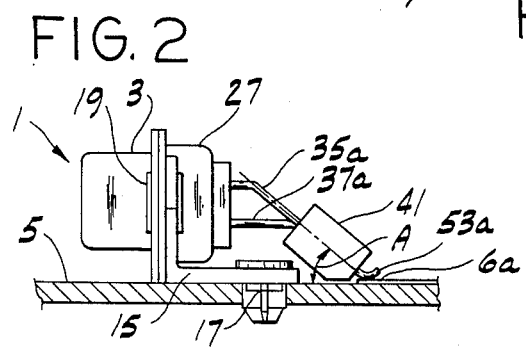
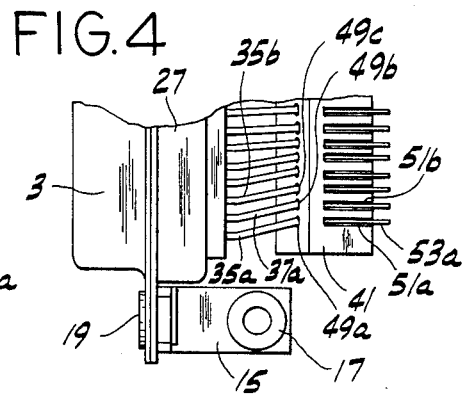
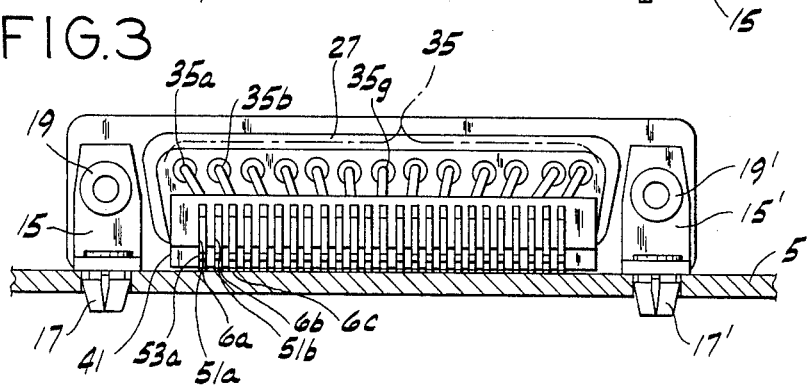
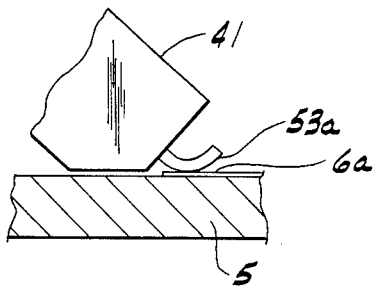

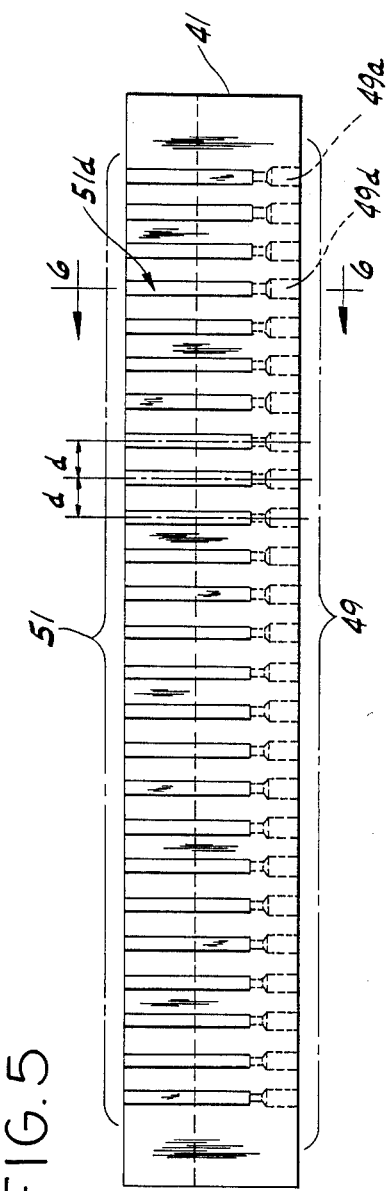
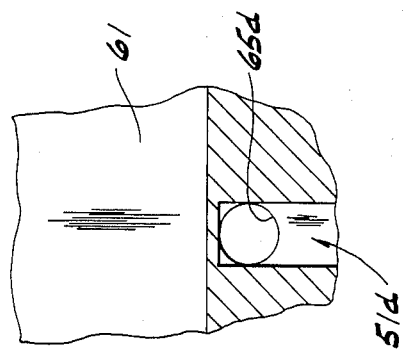
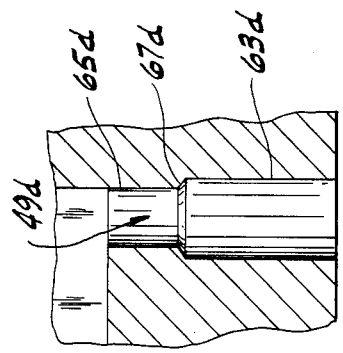
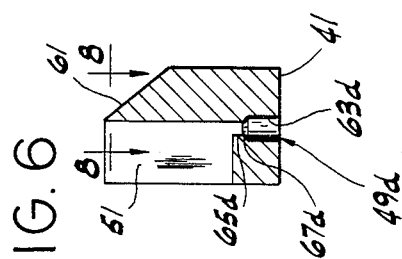

FIXED CONNECTOR FOR MAKING ELECTRICAL CONNECTIONS TO SURFACE-MOUNT TYPE PRINTED BOARD

BACKGROUND OF THE INVENTION

This invention relates to a fixed connector for connecting multiple electrical conductors to surface-mount type traces on a printed board.

For electrically connecting the conductors of a cable to a printed board (i.e., a board for mounting of components on which connectors are made by printed circuitry) it is generally known that special connectors must be provided. These fixed connectors which are suitable for connection to matching cable or free connectors have been adapted primarily for use with standard printed boards having holes for insertion of connector contact terminations or contact tails. However, these connectors are not suitable for use with printed boards having surface-mount type conductive traces. These surface-mount type boards are constructed using surface-mount technology for producing printed boards with the conductive traces on the surface of the board. These surface-mount type printed boards have particular spacing of the conductive traces and therefore require connectors suitable for attachment to these conductive traces. The contact tails of standard interface connectors are spaced on centers usually different than the spacing of the conductor traces on the surface-mount type printed board. Because of the increasing use of surface-mount type boards it would be advantageous to rearrange the spacing of the connector contact terminations or contact tails for attachment to the conductive traces on the printed board.

SUMMARY OF THE INVENTION

Among the several objects of the invention may be noted the provision of a fixed connector which provides an electrical path to the conductive traces of a surface-mount type printed board from a connection to the electrical conductors of a cable; the provision of such fixed connector which aligns contact tails of the fixed connector to the spacing required on the printed board; the provision of such connector which positively positions and holds each contact tail in place against its corresponding trace on the printed board; and the provision of such connector which is economically feasible and commercially practical.

Briefly described, a fixed connector of the present invention is for use in making electrical connections from an electrical cable having a plurality of conductors to a printed board having surface-mount type conductive traces, the electrical cable having a free cable connector connected to the plurality of conductors. The fixed connector includes a connector device for holding rows of contact tails spaced with a predetermined center-to-center spacing, each contact tail for electrical conduction with one of the plurality of conductors of the electrical cable, the connector device connectable to the free cable connector. The fixed connector also includes an aligning device made of insulating material for aligning the contact tails, the aligning device having a plurality of holes spaced with a predetermined center-to-center spacing different than the predetermined spacing of the contact tails, the holes having centers which are in a single plane, each hole receiving a respective one of the contact tails, the contact tails protruding from the aligning device remote from the connector device for attachment to the conductive traces on the printed board.

Other objects and features will be in part apparent and in part pointed out hereinafter.

BRIEF DESCRIPTION OF THE DRAWINGS

FIG. 1 is a front view of the connector of the present invention;

FIG. 2 is a side view of the connector in FIG. 1;

FIG. 2A is a close-up view of the connector as shown in FIG. 2 near an area where the connector makes contact with a printed board;

FIG. 3 is a rear view of the connector in FIG. 1;

FIG. 4 is a portion of a plan view of the connector of FIG. 1;

FIG. 5 is a plan view of an aligning bar included in the connector of FIG. 1;

FIG. 6 is a cross sectional view along the plane 6—6 of FIG. 5;

FIG. 7 is a close-up view of a portion of the view shown in FIG. 6; and

FIG. 8 is a partial cross sectional view along the plane 8—8 of FIG. 6.

Corresponding reference characters indicate corresponding parts throughout the several views of the drawings.

DESCRIPTION OF A PREFERRED EMBODIMENT

In FIG. 1 the connector of the present invention includes a standard interface connector 1. For clarity, references to the "connector" are specifically referring to the connector 1 and references to the "fixed connector" are referring to the connector of the present invention. The term "fixed" is used to indicate that the connector of the present invention is connectable to a matching cable or free connector. The connector 1 has an insulator body 3 positioned above a printed board 5 having surface-mount type conductive traces or pads 6 (as shown in FIGS. 2 and 2A). The surface-mount type traces or pads may be used in place of drilling holes through the printed board 5. A row of connector contacts 7 is positioned above another row of connector contacts 9 inside the insulator body 3. As will be readily appreciated by the skilled worker, contacts 7 and 9 may be replaced by other types of contacts, for example male or female contacts of circular, square or rectangular cross sections. The connector 1 is of a standard type suitable for connection to a matching cable (free) connector (not shown) attached to a cable (not shown) having a plurality of conductors. Each of the contacts 7 and 9 may thus be connected to one of the plurality of conductors. The rows of contacts 7 and 9 are arranged such that the center-to-center spacing is a predetermined distance d. The connector 1 has contacts with center-to-center spacing of approximately 0.054 inch. Other standard interface connectors have center-to-center spacing of other dimensions.

In FIG. 2 an angle bracket 15 is attached to the board 5 by snap-in fastener 17 and secured to the connector 1 by a rivet 19, for example made of copper alloy, which passes through an opening in a connector body 27 and an opening in angle bracket 15. The snap-in fastener 17 is hollow and has a diametrical slot for easy insertion. The angle bracket 15 may also be used to provide a grounding path from the matching cable connector (not shown) through the connector 1 to the board 5. Two rows of contact tails 35 and 37 are held in place by the connector body 27 and each contact tail is an extension and an integral part of one of the contacts 7 to 9, i.e. each contact tail is in electrical conduction with a respective one of the contacts 7 and 9. For example in FIG. 2, contact tail 35a of a top row and 37a of a bottom row is shown. In this way, the connector 1 includes connector means for holding rows of contact tails spaced with a predetermined center-to-center spacing, each contact tail for electrical conduction with one of the plurality of conductors of the electrical cable, the connector means connectable to the free cable connector.

The contact tails are made of a resilient conducting material and each of the contact tails 35 has a portion parallel to the surface of the board 5 and another portion bent at an angle thereto at a point away from an aligning or alignment bar 41. Each of the contact tails 37 also has a portion parallel to the surface of the board 5 and another portion bent at an angle thereto at the aligning bar 41. The angle for the contact tails 35 and the angle for the contact tails 37 are the same angle A. The angle A may be varied and is shown, for example, at substantially 40 degrees. The aligning bar 41 is made of insulating material, for example insulating plastic, and is generally rectangularly shaped and has a flat side which is substantially parallel to and closely adjacent to the surface of the board 5.

As shown in FIG. 3 an angle bracket 15' is secured to the printed board 5 by a snap-in fastener 17' and is secured to the connector body 27 by a rivet 19'. The top row of contact tails 35 and a second row of contact tails 37 (not shown in FIG. 3) extend from the connector body 27 toward the aligning bar 41. The aligning bar 41 is remote from the connector 1 with each of both rows of contact tails 35 and 37 bent at an angle relative to the surface 5. Additionally, each of the contact tails 35 and 37 is bent at an angle toward a respective hole in the aligning bar 41. For example, contact tail 35g has virtually no angle toward its respective hole while contact tail 35a has the sharpest angle toward its respective hole.

As best seen in FIG. 4, the top row of contact tails 35 is inserted in every other one of holes 49 in the aligning bar 41. For example, contact tail 35a from the top row is inserted in hole 49a and contact tail 35b is inserted in hole 49c. Similarly, the bottom row of contact tails is inserted in corresponding holes of the aligning bar 41 starting with contact tail 37a inserted in hole 49b. The contact tails 35 and 37 extend through the holes 49 in the aligning bar 41 and into respective slots 51 on the opposite side of the aligning bar 51. For example, contact tail 35a is in slot 51a and contact tail 37a is inserted in slot 51b. Each contact tail protrudes or extends from the aligning bar 41 and is bent at an end nearest the surface of the printed board so that the end touches the conductive traces 6 on the surface 5. The ends 53 include a J-hook shaped portion which makes contact with the conductive traces 6 at a bent portion of ends 53. For example as shown in FIG. 2A, an end 53a of contact tail 35a makes contact with the conductive trace 6a on the surface of the printed board for attachment thereto. Each end 53 of contact tails 35 and 37 can be aligned with the conductive traces. Because the contact tails are made of resilient material the ends 53 at the surface tend to be held in place on or against the surface and may be easily attached by soldering.

In FIG. 5 the aligning bar 41 is shown in more detail. The holes 49 in bar 41 extend through bar 41 to corresponding slots 51 thus providing separation between the contact tails. The holes 49 are at the angle A relative to the surface 5 and are shown, for example, at substantially forty degrees. Centers of the holes 49 are formed in a single plane and the holes 49 and slots 51 have a predetermined center-to-center spacing d' which is different than the predetermined spacing d of contacts 7 and 9. Many surface-mount technology devices require spacing which is an integer multiple of 0.025 inch and thus the spacing d' matches the spacing of the conductive traces on the printed board 5. For example, the spacing d' may be 0.050 inch which is less than the 0.054 inch spacing d for the contacts 7 and 9. For metric applications the spacing d' may be a multiple of 0,50 mm.

The aligning bar 41 thus constitutes aligning means made of insulating material for aligning the contact tails, the aligning means having a plurality of holes spaced with a predetermined center-to-center spacing different than the predetermined spacing of the contact tails, the holes having centers which are in a single plane, each hole receiving a respective one of the contact tails, the contact tails protruding from the aligning means remote from the connector means for attachment to the conductive traces on the printed board.

In FIG. 6 the aligning bar 41 has a flat side 61 which is parallel to and above the surface of the printed board 5. FIG. 6 is an example of a cross section through any of the holes 49 and slots 51. As may best be seen in FIGS. 6 and 7 hole 49d has a section 63d which is wider than the contact tail. A narrow section 65d has a width close to that of the contact tail for grippingly holding or retaining the contact tail. As shown in FIG. 8 the section 65d of hole 49d is postioned at one end of the slot 51d. A further section 67d between sections 63d and 65d has an angled taper so that the contact tail may be easily inserted in section 63d and 65d may thus grippingly hold the contact tail.

The application of the connector of the present invention to the board 5 will now be described. The fixed connector is mounted on the board 5 by attaching the angle brackets 15 and 15' using the fasteners 17 and 17' respectively. Such mounting may be accomplished by hand or may advantageously be accomplished by robots. The brackets 15 and 15' may alternatively be mounted to the board 5 by screws or bolts and nuts in place of fasteners 17 and 17'. The connector is placed on the board 5 using the angle brackets 15 and 15' to assure proper positioning so that the ends 53 of the contact tails 35 and 37 align with the conductive traces on the surface of the printed board 5. Because the aligning bar 41 is above the board 5, the ends 53 are positively positioned in place on the conductive traces 6 by the resilient contact tails 35 and 37. The narrow section 65 of the holes 49 and the angle A enable the aligning bar 41 to tense the resilient contact tails and hold the ends 53 in place. Solder paste may be placed on the conductor traces of the printed board prior to the mounting of the connector and before the heat is applied for soldering of the contact tails to the conductive traces or pads. The matching cable (free) connector may then be coupled to the connector 1 so that there is electrical conduction between the conductors of the cable and the traces or pads on the surface of the printed board 5.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A fixed connector for use in making electrical connections from an electrical cable having a plurality of conductors to a printed board having surface-mount type conductive traces, the electrical cable having a free cable connector connected to the plurality of conductors, the fixed connector comprising:

connector means having generally parallel rows of connector contacts for electrical conduction with the conductors of the electrical cable, the centers of the connector contacts in one row being staggered in relation to the centers of the connector contacts in an adjacent row, each connector contact for electrical conduction with one of the plurality of conductors of the electrical cable, said connector means connectable to the free cable connector;

a plurality of electrically conductive contact tails, each in engagement with and extending from a respective connector contact; and aligning means made of an insulating materal for aligning the contact tails, the aligning means having a plurality of holes which receive the contact tails and align such tails into a single row, each hole receiving a respective contact tail, the contact tails protruding from the aligning means remote from the connector means for surface mounting attachment to the conductive traces on the printed board.

2. A fixed connector as set forth in claim 1 wherein the contact tails received in the aligning means are held at an angle relative to the surface of the printed board and the contact tails are bent at an end nearest the surface so that the ends make contact with the conductive traces on the printed board.

3. A fixed connector as set forth in claim 2 wherein the angle relative to the surface is substantially forty degrees and the aligning means has one flat side which lies above the surface.

4. A fixed connector as set forth in claim 1 wherein the predetermined spacing of the holes in the aligning means is an integer multiple of 0.025 inch, or 0,50 mm.

5. A fixed connector as set forth in claim 1 wherein the contact tails are made of resilient material so that ends of the contact tails nearest the surface tend to be held in place on the conductive traces of the printed board.

6. A fixed connector as set forth in claim 1 wherein the aligning means has equally spaced slots with the holes positioned at one end of the slots and each hole has a first section having a width close to that of the contact tail for grippingly holding the tail, a second section wider that the contact tail, and a third section between the first and second sections with an angled taper so that each of the contact tails is easily inserted in the first section.

7. A fixed connector as set forth in claim 1 wherein the aligning means is remote from the connector means.

8. A fixed connector as set forth in claim 1 further comprising an angle bracket fastened to the connector means for mounting on the surface of the printed board.

9. A fixed connector for use in making electrical connections from an electrical cable having a plurality of conductors to a printed board having surface-mount type conductive traces, the electrical cable having a free cable connector connected to the plurality of conductors, the fixed connector comprising:

a connector having two generally parallel rows of connector contacts for electrical conduction with the conductors of the electrical cable, the connector contacts having a predetermined center-to-center spacing defined by the distance between two adjacent planes of a series of parallel planes, each of said planes being perpendicular to the two rows of connector contacts with the center of each connector contact lying within a respective one of said planes, each connector contact for electrical conduction with a respective one of the plurality of conductors of the electrical cable, said connector connectable to the free cable connector;

a plurality of electrically conductive contact tails, each in engagement with and extending from a respective connector contact;

an angle bracket fastened to the connector for mounting the connector onto the surface of the printed board; and a generally rectangularly shaped alignment bar made of insulating material having a flat side for placement adjacent the surface of the printed board and a plurality of holes which receive the contact tails and align such tails into a single row, the holes having a predetermined center-to-center spacing less than the predetermined center-to-center spacing of the connector contacts, each hole receiving a respective contact tail on one side of the bar and each contact tail having a portion protruding from an opposite side of the bar at an angle relative to the surface of the printed board and the protruding portion bent at an end nearest the surface for surface mounting so that one of the conductive traces on the printed board is attachable to the contact tail near its end.

10. A fixed connector as set forth in claim 9 wherein each of the tails in one row of contact tails has a portion parallel to the surface of the printed board and another portion bent at the hole receiving the contact tail at an angle and each of the tails of the other row of contact tails has a portion parallel to the surface of the printed board and another portion bent at the same angle at a point away from the hole.

11. A fixed connector as set forth in claim 9 wherein the predetermined spacing of the holes in the alignment bar is an integer multiple of 0.025 inch, or 0,50 mm.

12. A fixed connector as set forth in claim 9 wherein the contact tails are made of resilient material so that ends of the contact tails nearest the surface tend to be held in place on the conductive traces of the printed board.

13. A fixed connector as set forth in claim 9 wherein the alignment bar has equally spaced slots with the holes positioned at one end of the slots and each hole has a first section having a width close to that of the contact tail for grippingly holding the tail, a second section wider than the contact tail, and a third section between the first and second sections with an angled taper so that each of the contact tails is easily inserted in the first section.

14. A fixed connector as set forth in claim 9 wherein the alignment bar is remote from the connector.

15. A fixed connector as set forth in claim 1, wherein the connector contacts from two adjacent rows of connector contacts have a center-to-center spacing that differs from the center-to-center spacing of the holes of the alignment means, the center-to-center spacing of the connector contacts being defined by the distance between two adjacent planes of a series of parallel planes, each of said planes being perpendicular to the two adjacent rows of connector contacts with the center of each connector contact of the two adjacent rows lying within a respective one of said planes.

16. A fixed connector as set forth in claim 15 wherein the connector means has two rows of connector contacts and the predetermined center-to-center spacing of the holes of the aligning means is less than the predetermined center-to-center spacing of the connector contacts.

17. A fixed connector as set forth in claim 16 wherein each of the tails in one row of contact tails has a portion parallel to the surface of the printed board and another portion bent at the hole receiving the contact tail at an angle and each of the contact tails of the other row of contact tails has a portion parallel to the surface of the printed board and another portion bent at the same angle at a point away from the hole.

* * * * *